United States Patent [19]

Holcombe, Jr., et al.

[11] Patent Number: 5,453,303
[45] Date of Patent: Sep. 26, 1995

[54] LOW SUBSTRATE TEMPERATURE DEPOSITION OF DIAMOND COATINGS DERIVED FROM GLASSY CARBON

[75] Inventors: Cressie E. Holcombe, Jr., Farragut; Roland D. Seals, Oak Ridge, both of Tenn.

[73] Assignee: The United States of America as represented by the United States Department of Energy, Washington, D.C.

[21] Appl. No.: 278,931

[22] Filed: Jul. 22, 1994

[51] Int. Cl.$^6$ .................................................. B05D 1/10
[52] U.S. Cl. ............................................ 427/450; 427/446
[58] Field of Search ...................................... 427/450, 446

[56] References Cited

U.S. PATENT DOCUMENTS

| | | | |
|---|---|---|---|
| 4,842,937 | 6/1989 | Meyer et al. | 428/408 |
| 4,988,421 | 1/1991 | Drawl et al. | 204/192 |
| 4,992,082 | 2/1991 | Drawl et al. | 51/295 |
| 4,999,225 | 3/1991 | Rotolico et al. | 427/455 |
| 5,368,897 | 11/1994 | Kurihara et al. | 427/450 |

FOREIGN PATENT DOCUMENTS

| | | |
|---|---|---|
| 0470644 | 2/1992 | European Pat. Off. . |
| 3141193 | 6/1991 | Japan . |

OTHER PUBLICATIONS

"Characterization of HVOF Sprayed $Cr_3C_2$ Coating", M. Sasaki, et al, Thermal Spray: International Advances in Coatings Technology, May–Jun./1992 pp. 165–169.

"Abrasion Wear Resistance of Carbide Coatings Deposited by Plasma and High Velocity Combustion Processes", K. Niemi, et al, Thermal Spray: International Advances in Coatings Technology, May–Jun./1992 pp. 685–689.

"Elevated temperature erosion of carbide–metal composite coatings", B. Q. Wang et al, Thermal Spray: International Advances in Coatings Technology, May–Jun./1992 pp. 735–742.

"Ceramic Coatings Obtained by Means of HVOF Thermal Spraying" by J. M. Guilemany, pmi vol. 25, No. 4, 1993, pp. 176–179 (no month date).

"The Application of High Velocity Combustion Spraying" by A. R. Nicoll, et al., Int'l. Thermal Spray Conf. & Exp. May–Jun./1992. ASM Int'l. 1992.

"HVOF Process:The Hottest Topic in the Thermal Spray Industry" by Irving, et al., Welding Journal, Jul./1993, pp. 25–30.

Primary Examiner—Shrive Beck
Assistant Examiner—Katherine A. Bareford
Attorney, Agent, or Firm—David E. Breeden; Stephen D. Hamel; William R. Moser

[57] ABSTRACT

A process for depositing a diamond coating on a substrate at temperatures less than about 550° C. A powder mixture of glassy carbon and diamond particles is passed through a high velocity oxy-flame apparatus whereupon the powders are heated prior to impingement at high velocity against the substrate. The powder mixture contains between 5 and 50 powder volume percent of the diamond particles, and preferably between 5 and 15 powder volume percent. The particles have a size from about 5 to about 100 micrometers, with the diamond particles being about 5 to about 30 micrometers. The flame of the apparatus provides a velocity of about 350 to about 1000 meters per second, with the result that upon impingement upon the substrate, the glassy carbon is phase transformed to diamond as coaxed by the diamond content of the powder mixture.

20 Claims, 2 Drawing Sheets

LOW SUBSTRATE TEMPERATURE DEPOSITION OF DIAMOND COATINGS DERIVED FROM GLASSY CARBON This invention was made with Government support under Contract DE-AC05-84OR21400 awarded by the United States Department of Energy to Martin Marietta Energy Systems, Inc. and the U.S. Government has certain rights in this invention.

TECHNICAL FIELD

The present invention relates generally to the formation of diamond coatings upon substrates, and more particularly to the formation of such diamond coatings at substrate temperatures generally less than about 500° C. The coatings are prepared using a high velocity oxy-flame (HVOF) techniques with the feed material being glassy carbon with a small amount of diamond mixed therewith.

BACKGROUND ART

It is well known that the use of diamond coatings offers many advantages in several fields of use. For example, diamond-coated saws and drills are used to cut concrete and steel. Drill bits coated with a thin layer of diamond may be used at much higher rotational velocities with much greater efficiency than standard drill bits. In the field of surgery, some procedures require ultra-sharp scalpels, some of which are coated with a thin diamond film. These are just a few of the many applications for diamond-coated devices.

The advantages given by diamond coating are due mainly to the physical characteristics of the diamond. Namely, diamonds exhibit low expansion when heated and-have a high degree of hardness and heat conductivity. Diamond also has a low coefficient of friction.

The deposition of thin diamond coatings, in general, has been taught by others. Typically, thin diamond films produced by the prior art are only a few Angstroms to about 1 micron thick. These teachings are disclosed in the following patents:

U.S. Pat. No. 4,842,937 issued to Meyer, et al, on Jun. 27, 1989;

U.S. Pat. No. 4,988,421 issued to Drawl, et al, on Jan. 29, 1991

U.S. Pat. No. 4,992,082 issued to Drawls et al, on Feb. 12, 1991;

E. P. Patent 470,644 issued to Bigelow on Feb. 12, 1992; and

Japanese Patent 3,141,193 issued to Kurihara on Oct. 24, 1989.

Each of these references only teaches the formation of very thin films, with multiple thin layers being utilized to form a diamond coating of any substantial thickness. However, it is also well known that each layer that is added increases the complexity of the manufacture. Further, the composition of the different layers can vary substantially. This can be detrimental to the performance of the final diamond coating.

In order to overcome the problems inherent in producing a multiplicity of thin layers of diamond, the present inventors assisted in the development of a method of forming "thick" diamond coatings. This resulted in a process described and claimed in co-pending U.S. patent application Ser. No. 08/003,274, abandoned, filed Jan. 12, 1993, and assigned to a common assignee with the present invention. In the process described therein, glassy carbon with (or without) additives is caused to be heated in a plasma and then directed against a substrate where, by solid state transformation, the glassy carbon is converted to diamond. While this resulted in thick diamond coatings, the substrate temperature reaches temperatures in excess of 500° C. because the plasma exiting the "gun" is 10,000 to 20,000 degrees, with this plasma being only about six inches from the substrate. For some applications of diamond coating, this temperature would be detrimental to the substrate.

DISCLOSURE OF THE INVENTION

In accordance with the present invention, a diamond coating of a substrate is achieved by passing a mixture of glassy carbon and diamond particles through a high velocity oxy-flame (HVOF) apparatus whereupon the glassy carbon portion of the material striking the substrate is caused to form diamond through solid state transformation. This transformation occurs at temperatures generally less than about 550° C., even as low as about 150° C. The feed mixture comprises mainly vitreous carbon, commonly referred to as "glassy carbon" with the diamond composition being from about 5 to about 50 wt. %. Because of the low substrate temperature, diamond coatings can be applied to a wide range of materials, even some plastics. Additionally, the HVOF method leads to fully-dense layers—an advantage over some prior art methods.

BEST MODE FOR CARRYING OUT THE INVENTION

A relatively new thermal spraying process has been developed in the art which is called the "High Velocity Oxy-Flame" (HVOF) process. In this process, a powder is caused to pass through a flame (created by a burning fuel) and to be directed against a selected substrate at a high velocity created by the flame. The process has been utilized, for example, to thermally spray a metal powder to fill depressions in metallic substrates. In other applications, it has been utilized to produce ceramic coatings. The latter is described in PMI, Vol. 25, No. 4 (1993), pages 176–179. Another description is given in "The Application of High Velocity Combustion Spraying" "Characterization of HVOF Sprayed $Cr_3C_2$ Coating", "Abrasion Wear Resistance of Carbide Coatings Deposited by Plasma and High Velocity Combustion Processes", and "Elevated Temperature Erosion of Carbide-Metal Composite Coatings", Proco International Thermal Spray Conference & Exposition, Orlando, Fla. May 25–Jun. 5, 1992, pages 149–152, 165–170, 685–689, and 735–741, respectively.

Figure 1:
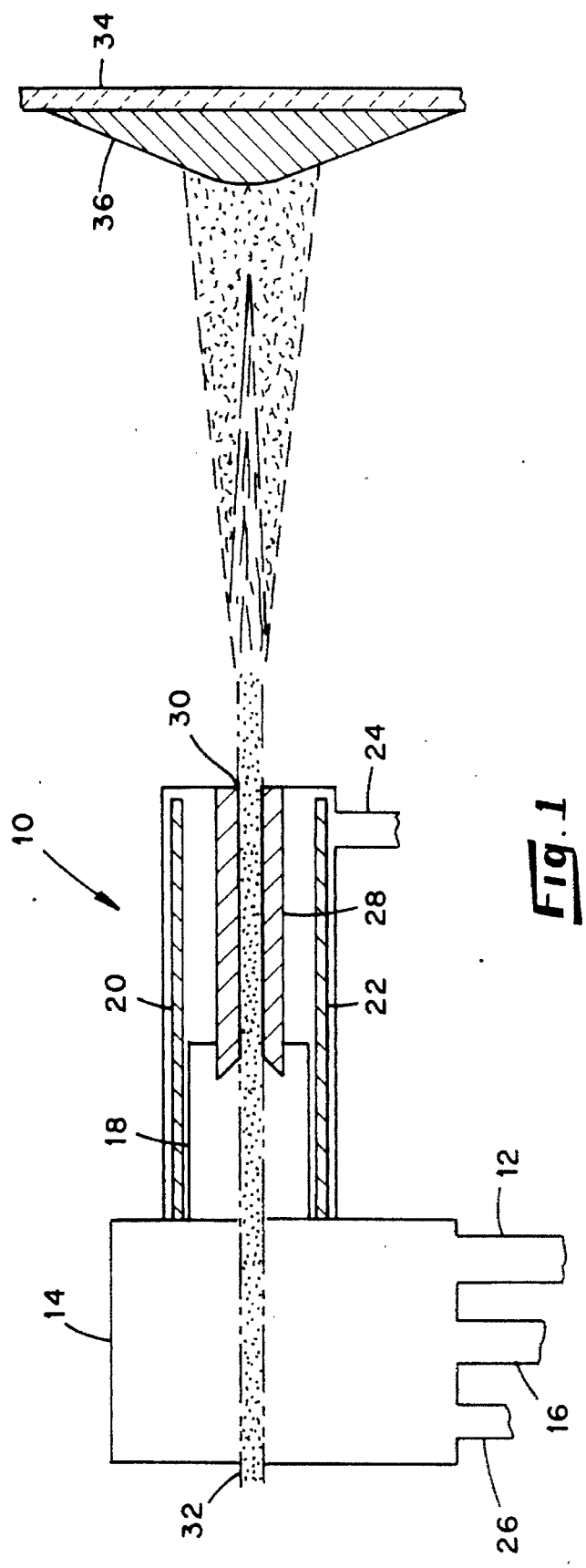
FIG. 1 is a schematic drawing illustrating the high velocity oxy-flame thermal spraying process as utilized in the present invention.

The HVOF process can be best understood by reference to FIG. 1. This depicts, generally at 10 a device such as the CDS-100 Plasma Technik AG apparatus, which is a typical apparatus for HVOF. Components are shown schematically, and in this figure a fuel gas is fed at 12 into a combustion chamber 14 Typically, this fuel gas is propylene, hydrogen, acetylene, propane, etc. An oxidizing gas, such as oxygen or air, is fed into this chamber 14 at 16. Of course, such gases can be premixed under controlled conditions if preferred. In some apparatus, a second or alternate combustion chamber 18 is utilized. Because of the high temperature involved in the burning of the gases, a cooling jacket is provided, such as indicated at 20 external a baffle 22, with coolant entering at 24 and exiting at 26. A flame channel 28 defines the path of the flame whereupon it exits the "torch" at 30. Powder for the HVOF apparatus typically enters at 32 under a slight positive pressure such that it moves through the combustion chamber 12. As it reaches the flame channel 28 the powder particles are heated to the flame temperature and exit with the flame so as to be directed to a substrate 34 to produce, in the present process, a diamond coating 36 upon the substrate 34.

A chemical reaction of a fuel gas with oxygen produces a supersonic gas jet of 350–1000 m/s, and heats particles to about 2000°–4000° C. (depending upon the fuel utilized). In actuality, even though the fuel/oxygen mixture is burned in very rapid pulses, the exiting jet appears as a continuous stream, However, since the heated particles travel a substantial distance (typically 24–36 inches) after leaving the torch, before impinging upon the substrate, they are cooled to relatively low temperatures. When the particles strike the substrate at the high velocity, they are effectively "hot forged" upon the substrate, and phase transformation occurs even at this reduced temperature.

As stated above, the plasma process for depositing diamond coatings disclosed in the afore-cited U.S. patent application No. 08/003,274 involves substrate temperatures generally well in excess of 500° C., and usually nearly double that temperature. In an effort to reduce this substrate temperature, the HVOF thermal spraying process was investigated. This study was initiated even though the carbon phase diagram would suggest to persons skilled in the art that a phase transformation would occur only at significantly higher pressures and temperatures. Also, the oxygen content of the HVOF fuel gases would suggest oxidation of the carbon feedstock.

Sample substrates for the diamond deposition HVOF process were tantalum discs about three inches in diameter and 3/16 inch thick. Feed material to the HVOF apparatus were those that had been found to be successful in the plasma coating (see prior cited patent application): vitreous carbon (commonly known as glassy carbon); a mixture of glassy carbon and diamond particles; and glassy carbon and boron carbide particles. More specifically, the mixed feeds were 90:10 powder volume ratios of the glassy carbon to the second constituent (either the diamond or boron carbide. In all cases the particles were in the range of 5 to 100 micrometers. The diamond particles were, for example, five to thirty micrometers, with an average of about twenty micrometers. Typically, the glassy carbon had a particle size of about 25 to 75 micrometers. The total size ranges of the particles can be 5 to 75 micrometers. For all of the materials tested, an inert carrier gas (nitrogens argon, helium, etc.) introduced the powder into the HVOF apparatus, and a flame produced by a propylene-oxygen mixture was used. The fuel mixture was generally "rich" in the hydrocarbon so that reducing conditions existed. Depositions were made onto the substrate in both "hot" and "cold" conditions: the "hot" condition was as hot as normal for the HVOF process (about 550° C.); and the "cold" was as cold as could be achieved by rapid movement of the spray gun and maximizing the standoff distance (typically about 150° C. at 36 inches).

Figure 2:
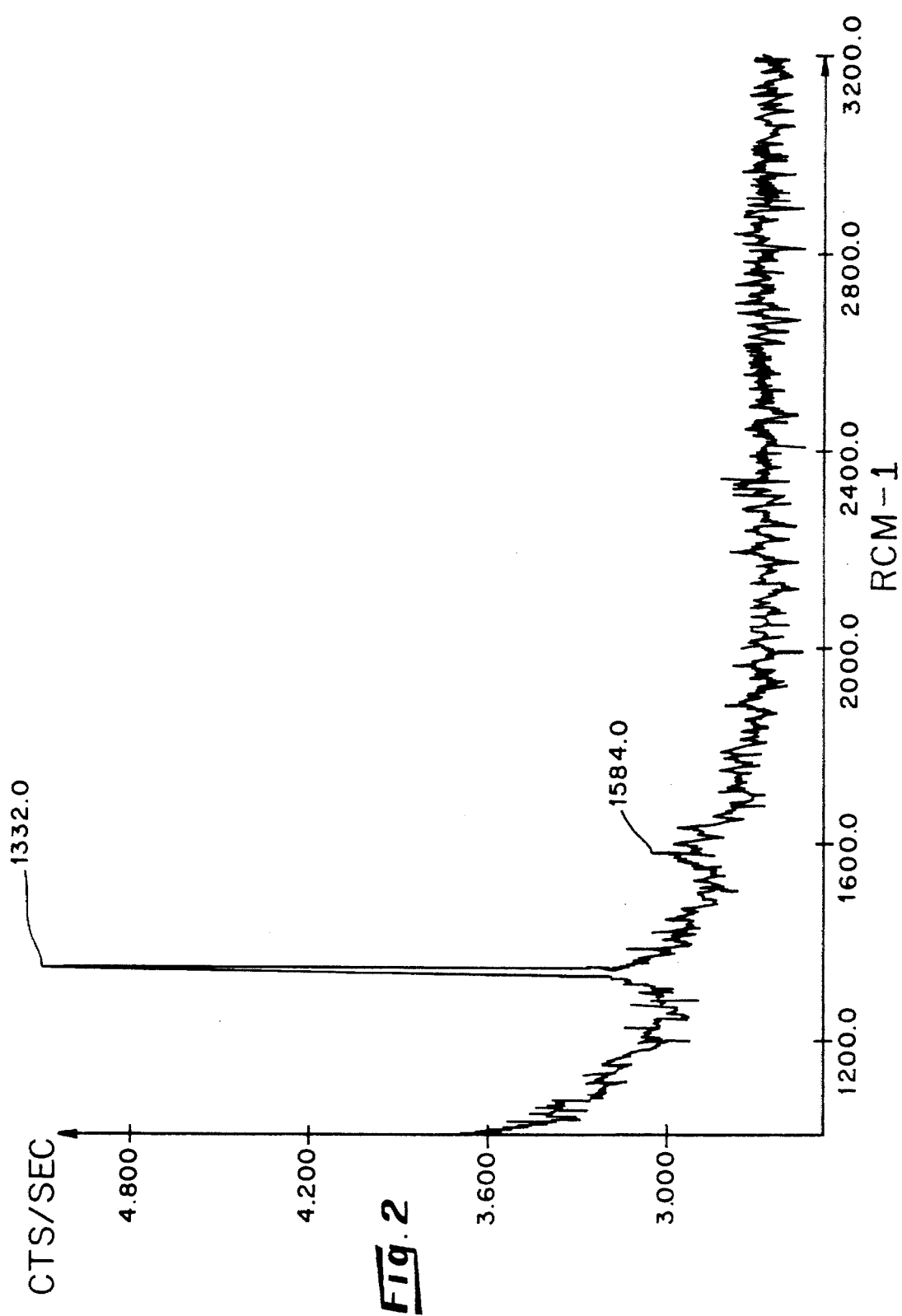
FIG. 2 is a Raman spectrograph of the product of the high velocity oxy-flame thermal spraying process as a verification of the production of a diamond coating in contrast to a mixed coating.

The resultant coatings were analyzed by Raman spectroscopy. It was found that when the feed was entirely glassy carbon, the coating was solely glassy carbon for either the hot or the cold deposition. Further, when the feed was a mixture of glassy carbon and boron carbides the resultant coating contained the same two ingredients for either the hot or the cold deposition. However, the mixed feed of glassy carbon and diamond (90:10 powder volume ratio) produced a coating that was only diamond. The Raman spectrograph of this analysis is shown in FIG. 2. The diamond is identified at the 1332 position. Since the diamond layer occurs by solid phase transformation, the diamond coating can be "built" to a desired thickness, with the entire coating having the same composition.

Although the tests were conducted with a glassy carbon to diamond powder volume ratio of 90:10, the diamond powder proportion can be varied from about 5 to 50 powder volume. A preferred proportion range of diamond powder can be 5 to 15 powder volume. Concentrations lower than about 5 powder volume may not "coax" the phase transformation of the glassy carbon into diamond. The upper side of the range is governed by economics: the greater the percent diamond, the higher the cost of creating the diamond coating. Thus, the upper end of the range may be about 50 powder volume ratio depending upon the value added by providing the diamond coated surface.

From the foregoing, it will be understood by persons skilled in the art that a coating that is fully diamond can be applied to substrates at temperatures much reduced from those required for other diamond coating processes. This will permit the application of diamond coatings to a wider range of types of substrates, even upon plastics. Thus, protective coatings are now possible for many devices.

Although certain conditions are set forth above in connection with the present invention, these are for illustration and not for limitation, Rather, the invention is to be limited only by the appended claims and their equivalents.

We claim:

1. A process for producing a diamond coating upon a substrate which comprises passing a diamond precursor powder through a high velocity oxy-flame apparatus for heating the powder, and impinging said heated powder upon said substrate at a temperature between about 150° and 550° C., said diamond precursor powder having particle sizes of between about five to about 100 micrometers, said diamond precursor powder being a mixture of glassy carbon particles and diamond particles, said diamond particles making up from about 5 to about 50 powder volume percent of said mixture.

2. The process of claim 1 wherein said glassy carbon particles are between about 25 and 75 micrometers in size, and said diamond particles are about 5 to about 30 micrometers in size.

3. The process of claim 1 wherein said diamond particles make up about 10 powder volume percent of said mixture.

4. The process of claim 1 wherein said powder mixture is introduced into said high velocity oxy-flame apparatus with a flow of an inert gas.

5. The process of claim 4 wherein said inert gas is selected from the group consisting of nitrogen, argon and helium.

6. The process of claim 1 wherein a high velocity flame is created within said high velocity oxy-flame apparatus by burning a hydrogen-containing gas in the presence of an oxygen-containing gas.

7. The process of claim 6 wherein said hydrogen-containing gas is propylene.

8. The process of claim 6 wherein an excess of hydrogen-containing gas is used relative to said oxygen-containing gas so as to produce a reducing condition within said flame.

9. The process of claim 6 wherein said heated mixture is propelled against the substrate at a velocity of about 350 to about 1000 meters per second by said flame.

10. A process for producing a diamond coating upon a substrate which comprises the steps:

preparing a mixture of powders of glassy carbon and diamond, said mixture having from about 5 to about 50 powder volume percent of diamond, said mixture having particles of about 5 to about 75 micrometers in size;

passing said mixture of powders through a high velocity oxy-flame apparatus for heating said powder mixture; and impinging said heated mixture of powders upon the substrate at a temperature between about 150° and 550° C.

11. The process of claim 10 wherein said glassy carbon particles are between about 25 and 75 micrometers in size, and said diamond particles are about 5 to about 30 micrometers in size.

12. The process of claim 10 wherein said diamond particles make up about 10 powder volume percent of said mixture.

13. The process of claim 10 wherein said powder mixture is introduced into said high velocity oxy-flame apparatus with a flow of an inert gas.

14. The process of claim 13 wherein said inert gas is selected from the group consisting of nitrogen, argon and helium.

15. The process of claim 10 herein a high velocity flame is created within said high velocity oxy-flame apparatus by burning a hydrogen-containing gas in the presence of an oxygen-containing gas.

16. The process of claim 15 wherein said hydrogen-containing gas is propylene.

17. The process of claim 15 wherein said hydrogen-containing gas is in excess of that required for burning in said oxygen to produce a reducing condition within said flame.

18. The process of claim 10 wherein said heated mixture is propelled against the substrate by said flame at a velocity of about 350 about 1000 meters per second.

19. A process for producing a diamond coating upon a substrate which comprises the steps:

preparing a mixture of powders of glassy carbon and diamond, said mixture having from about 5 to about 15 powder volume percent of diamond powder having a particle size of about 5 to about 30 micrometers, said glassy carbon having particles of about 25 to about 75 micrometers in size;

forming a flame within a high velocity oxy-flame apparatus by introducing, and burning, a mixture of a hydrogen-containing gas and an oxygen-containing gas into the high velocity oxy-flame apparatus to produce a flame velocity exiting the high velocity oxy-flame apparatus at about 350 to about 1000 meters per second;

passing said mixture of powders through the high velocity oxy-flame apparatus for heating said powder mixture; and impinging said heated mixture of powders upon the substrate at said velocity and at a temperature between about 150° and 550° C. to produce said diamond coating by phase transformation of said glassy carbon into diamond.

20. The process of claim 19 wherein said hydrogen-containing gas is propylene, and said mixture of powders is carried into the high velocity oxy-flame apparatus with a flow of nitrogen gas.

* * * * *